*United States Patent* [19]

Fukumoto

[11] Patent Number: 5,789,685
[45] Date of Patent: Aug. 4, 1998

[54] STRUCTURE OF ROTARY ARM AND DEVICE CHUCK PART OF A DEVICE HANDLER

[75] Inventor: Keiichi Fukumoto, Kitamoto, Japan

[73] Assignee: Advantest Corporation, Tokyo, Japan

[21] Appl. No.: 773,105

[22] Filed: Dec. 26, 1996

[30] Foreign Application Priority Data

Dec. 27, 1995 [JP] Japan .................... 7-341096

[51] Int. Cl.[6] .................................... G01R 1/04
[52] U.S. Cl. .................................... 73/865.8
[58] Field of Search .................... 73/865.8; 324/754, 324/757–760; 209/571–575

[56] References Cited

U.S. PATENT DOCUMENTS 3,750,878  8/1973  Atchley et al. ............ 209/573
5,374,888  12/1994  Karasawa ................. 324/754

*Primary Examiner*—Robert Raevis
*Attorney, Agent, or Firm*—Staas & Halsey

[57] ABSTRACT

A device handler prevents a dropping of a device chuck mounted to a rotary arm owing to a breaking of a coil spring and a stoppage of the device chuck at an elevation in the mid way of vertical movements owing to a defect or failure of a linear guide, preventing the device chuck and/or an exit stage from being damaged or broken. A first guide rail is provided along a downwardly inclined camming surface of a cam member extending from the vicinity above a soak stage to a vicinity above a measuring section, and a second guide rail is provided along an upwardly inclined camming surface of the cam member extending from the vicinity above the measuring section to the vicinity above the exit stage. In addition, on the opposite side of a cam holder about the rotary shaft of the rotary arm unit is placed an arcuate dropping preventive plate mounted to the props depending from the ceiling insulation wall of the constant temperature chamber like the cam holder. Further, a hook is mounted to the upper portion of each of the device chucks. The hook can slide on any one of the first guide rail, the second guide rail, and the dropping preventive plate in the manner engaged therewith when an accident occurs.

8 Claims, 7 Drawing Sheets

ROTATING DIRECTION

STRUCTURE OF ROTARY ARM AND DEVICE CHUCK PART OF A DEVICE HANDLER

FIELD OF THE INVENTION

The present invention relates generally to a semiconductor device transporting and handling apparatus (commonly called IC handler) which is suitable for use, in an IC testing apparatus (commonly called IC tester) for testing ICs (semiconductor integrated circuits) typical of semiconductor devices, for transporting ICs for testing through the IC tester and sorting the tested ICs out. More particularly, the present invention relates to a structure or construction of rotary arm and device chuck part of the IC handler which is used for transporting one or more ICs to be tested or under test (commonly called DUT) from a soak stage to a measuring section (also referred to as testing section) of the IC tester as well as transporting the tested ICs from the measuring section to an exit stage.

BACKGROUND OF THE RELATED ART

FIG. 4 illustrates the general construction of one example of the conventional IC handler referred to as a horizontal transporting system. Disposed in the housing of the IC handler 1 along the lower side thereof as viewed in the drawing are a loader section 10, an empty tray buffer stage 9 and an unloader section 8 successively from left to right. The leftmost loader section 10 in the drawing contains a plurality of trays stacked one on another each loaded with a plurality of ICs to be tested (DUTs).

A loader carrier arm 11 picks up two ICs at a time, in this example, from the uppermost tray of the stacked tray group positioned at the loader section, and transports them onto a turntable 5 referred to as a soak stage. Two rows of positioning recesses for defining the positions for receiving the DUTs 7 are formed in the turntable 5 at substantially equal angular intervals on concentric circles. Each positioning recess is of substantially square shape and is surrounded on four sides thereof by upwardly inclined walls. Each time the turntable 5 rotates by one pitch, the carrier arm 11 drops two ICs down into one positioning recess in each of the two rows of recesses. The DUTs 7 conveyed by the turntable 5 are delivered into the measuring section 4 by a rotary arm unit 3 (also referred to as a contact arm unit). Specifically, the rotary arm unit 3 is adapted to pick up by vacuum suction two DUTs 7, one from each of the positioning recesses of the two rows in the turntable 5 and transports them to the measuring section 4.

The rotary arm unit 3 has three arms 3b secured to a rotary shaft 3a at substantially equal angular intervals and performs the operations, by rotation of the three arms, of successively delivering the DUTs 7 to the measuring section 4 and of successively transferring the ICs tested in the measuring section 4 to a rotary arm unit 6 referred to as exit stage which may be of construction similar to the rotary arm unit 3. It should be noted that the soak stage 5, the rotary arm unit 3 and the measuring section 4 are contained in a constant temperature chamber 2 (commonly called chamber) so that DUTs 7 may undergo the testing within the chamber 2 while being maintained at a predetermined temperature. The exit stage 6 is so configured that one of its arms is normally positioned in the interior of the constant temperature chamber 2.

The tested ICs taken out of the constant temperature chamber 2 by the exit stage 6 located at the outside of the exit of the chamber 2 are delivered to the unloader section 8 where there are mounted a Y carrier arm 8y movable in a Y direction (up-and-down direction as viewed in the drawing) and an X carrier arm 8x movable in an X direction (left-and-right direction as viewed in the drawing) each equipped with a chuck 8d for picking up and grasping tested ICs. Also disposed in the unloader section 8 are three trays 8a, 8b and 8c in this example. Each of the tested ICs received from the exit stage 6 is sorted out on the basis of the test results and stored in corresponding one of the three trays 8a, 8b and 8c in this example. By way of example, conforming (pass) ICs are stored in a tray 8a whereas a first class of unconformable (failure) ICs (those requiring re-testing, for instance) and a second class of unconformable ICs (completely failure or defective ones, for instance) are stored in a tray 8b and a tray 8c, respectively. This sorting is performed by the X carrier arm 8x.

The empty tray buffer stage 9 located to the right side of loader section 10 in the drawing is to accommodate trays emptied of DUTs in the loader section. Trays stored in the empty tray buffer stage 9 are transported to the unloader section 8 by a tray carrier 12 as required. For example, when any one of the three trays in the unloader section is filled with ICs, one of the empty trays is conveyed to the top of the filled tray to be used to store ICs therein.

The rotary arm unit 3 will be described in more detail. As described above, the rotary arm unit 3 includes the rotary shaft 3a having three arms 3b extending radially therefrom at angular intervals of 120°. As shown in FIGS. 5 and 6, a device chuck 21 is mounted for vertical movements on the outer vertical wall face of each of the arms 3b by means of a linear guide 21a. A tension coil spring 22 is provided extending between a portion of each device chuck 21 adjacent its lower end and a portion of the corresponding arm 3b adjacent its top surface so that the device chuck 21 is normally urged upwardly and kept stationary at a predetermined position (the uppermost position) along the vertical wall of the arm 3b by the tensile force of the coil spring 22.

A cam member 24 is mounted adjacent the rotary arm unit 3 concentrically with the rotary shaft 3a of the rotary arm unit 3. The cam member 24 comprises an upper substantially semi-annular ring portion in plan view having a generally inverted triangular (see FIG. 6) portion (peripheral surface) depending downwardly therefrom, and two legs (or sides) extending oppositely from the apex of the inverted triangular portion (inverted triangle) act as camming surfaces, respectively. On the other hand, a cam follower 21b is rotatably supported on each of the device chucks 21 mounted for vertical movements on the outer vertical wall faces of the corresponding arms 3b of the rotary arm unit 3, and is adapted to follow the camming surfaces of the cam member 24.

The cam member 24 has its upper substantially semi-annular ring portion screwed to a cam holder 25 concentrically with the rotary shaft 3a, the cam holder 25 being of an arcuate shape concentric with the rotary shaft 3a and screwed to the lower ends of a plurality of posts 29 depending from the ceiling insulation wall 28 of the constant temperature chamber 2. The cam member 24 is thus fixed and will not itself move to drive the cam follower 21, but is called "cam" in this disclosure. In the instant case, as is apparent from FIG. 6, the cam member 24 is secured to the cam holder 25 such that the apex of the depending inverted triangular portion of the cam member 24 will be brought into abutment with the cam follower 21b rotatably mounted on the device chuck 21 which is placed on a position above the measuring section 4. It is thus to be understood that the camming portion of the cam member 24 includes the downwardly inclined surface 24a and the upwardly inclined surface 24b divided by the apex of the inverted triangle with respect to the rotational movement of the cam follower 21b.

With the cam member 24 and the cam follower 21b constructed as described above, as the rotary arm unit 3 is rotated through 120°, the cam followers 21b of two (the device chuck rotating from the soak stage 5 to the measuring section 4 and the device chuck rotating from the measuring section to the exit stage 6) of the three device chucks 21 rotated together with the rotary arm unit 3 are caused to follow in motion the downwardly inclined camming surface 24a and the upwardly inclined camming surface 24b, respectively. Accordingly, the device chuck 21 rotating from the soak stage 5 to the measuring section 4 is caused to gradually descend while following the downwardly inclined camming surface 24a and reaches the lowermost position when it comes to a position immediately above the measuring section 4, and simultaneously the device chuck rotating from the measuring section 4 to the exit stage 6 is caused to gradually rise while following the upwardly inclined camming surface 24b and returns to the original predetermined position (the uppermost position) when it comes to a position above the exit stage 6. This is because the peripheral length of the upper substantially semi-annular ring portion of the cam member 24 is shorter than 180°, and hence the DUT delivery station 5a and the DUT receiving station 6a spaced apart from each other by about 240° in the major arc including the upper semi-annular ring portion of the cam member 24 are positioned outside of the upper semi-annular ring portion of the cam member 24.

As is seen in FIG. 6, the chamber insulation wall 28 of the constant temperature chamber 2 is of three-layered construction composed of a layer 28b of insulation material, an aluminum plate 28a mounted on the outer surface of the insulation layer 28b and a stainless steel plate 28c mounted on the inner surface of the insulation layer 28b.

More specifically, each device chuck 21 picks up by suction a DUT at a predetermined position over the DUT delivery station 5a of the soak stage 5, followed by rotating through 120° to a position immediately above the measuring section 4. During this 120° rotation as the cam follower 21b follows in motion the downwardly inclined camming surface 24a of the cam member 24, the associated device chuck 21 gradually descends to a lower position against the resilient force of the coil spring 22 from the normal predetermined position (the uppermost position) and it comes into abutment with the apex of the inverted triangle of the cam member 24 as shown in FIG. 6 upon completion of the 120° rotation. At this point of time, the associated device chuck 21 is at a position immediately above the measuring section 4 and at the lowermost position where the operation of a contact-press cylinder 33 described later brings the DUT into positive contact with the IC socket 4b on the performance board 4f of the IC tester to effect the preselected measurements. Upon completion of the measurements, the rotary arm unit 3 is rotated through another 120° during which as the cam follower 21b follows in motion the upwardly inclined camming surface 24b of the cam member 24, the device chuck 21 gradually rises from the lowermost position to the original predetermined position (the uppermost position) under the tensioning force of the coil spring 22. In this manner, at the end of this another 120° rotation, the device chuck 21 is at a predetermined position over the receiving station 6a of the exit stage 6.

The reason why the cam member 24 is provided will be described. The conventional IC handler of horizontal transporting system illustrated in FIGS. 5 and 6 is configured such that the measuring section 4 is located at an elevation lower than that of the soak stage 5 and the exit stage 6. As a result, if the cam member 24 is not provided, the stroke (distance) of the device chuck 21 regarding its vertical movements between the normal predetermined position (the uppermost position) of the device chuck 21 and a predetermined position (the lowermost position) immediately above the measuring section 4 assumed by the device chuck 21 holding the DUT attracted by suction for electrically contacting the DUT with the IC socket 4b becomes longer, as compared with the stroke of the device chuck between the normal predetermined position (the uppermost position) and a predetermined position (the lowermost position) close to the DUT delivery station 5a of the soak stage 5 or the stroke of the device chuck between the normal predetermined position (the uppermost position) and a predetermined position (the lowermost position) close to the DUT receiving station 6a of the exit stage 6. This requires a longer time that the device chuck 21 carries out the vertical movements at the measuring section 4, and hence the throughput (processing capacity) of the IC handler is lowered. In order to prevent this deteriorative problem from being caused, the cam member 24 having the camming portion (camming surfaces 24a and 24b) of the inverted triangle discussed above is provided thereby causing the device chuck 21 to gradually descend or ascend along the cam member 24 while the device chuck 21 is rotated through 120°. Consequently, the stroke required for the device chuck 21 to effect the vertical movements at the measuring section 4 is minimized.

As shown in FIG. 6, a contact-in cylinder 32, a contact-press cylinder 33 and contact-out cylinder 34 are employed to lower the device chuck 21 at the DUT delivery station 5a of the soak stage 5, the measuring section 4, and the DUT receiving station 6a of the exit stage 6, respectively. Specifically, the contact-in cylinder 32 is employed to lower the device chuck 21 to a predetermined position close enough to the DUT delivery station 5a of the soak stage 5 for the device chuck to attract and hold a DUT thereagainst at the DUT delivery station 5a. The contact-press cylinder 33 is employed to lower the device chuck 21 holding a DUT attracted thereagainst so as to bring the leads of the DUT into electrical contact with an IC socket 4b at the measuring section 4. The contact-out cylinder 34 is employed to lower the device chuck 21 holding a tested DUT attracted thereagainst to a predetermined position close enough to the DUT receiving station 6a of the exit stage 6 to release the DUT at the DUT receiving station 6a.

The measuring section 4 is located at the bottom of the constant temperature chamber 2, and includes an IC socket 4b disposed in a socket guide 4c which is, in turn, mounted on a performance board 4f of the IC tester. The IC socket 4b is mounted by means of an adapter socket 4d on the performance board 4f and is exposed in the constant temperature chamber 2 through an opening 39 formed through the insulation wall 28 which is the bottom of the constant temperature chamber 2. This IC socket 4b is secured at a predetermined position by screwing the socket guide 4c to the chamber insulation wall 28. The socket guide 4c has guide pins 4a upstanding from the top surface thereof, the guide pins 4a being so configured as to guide the device chuck 21, as the chuck 21 is lowered, to position a DUT attracted and held by the chuck into the IC socket 4b at a predetermined position thereof. It is seen in the drawing that the performance board 4f is in electrical contact with the test head 43 of the IC tester by means of contact pins 41a.

The operation of the rotary arm unit and device chuck part constructed as discussed above will now be described with reference to FIG. 7.

(a) When the rotary arm unit 3 is rotated or indexed through 120° whereby one of the device chucks 21 which is at the original predetermined position (the uppermost position) is turned to a predetermined position adjacent the DUT delivery station 5a of the soak stage 5, the contact-in cylinder 32 is turned on (actuated) to force the device chuck 21 to be moved down from the predetermined position (the uppermost position) to a lower position against the biasing force of the coil spring 22 where the suction pad 21c comes into engagement with a DUT.

(b) Next, a vacuum generating apparatus for aspirating air by suction from the suction pad 21c is then energized to firmly attract and hold the DUT against the suction pad 21c.

(c) Then, the contact-in cylinder 32 is turned off (de-actuated) so that the device chuck 21 carrying the DUT attracted thereagainst is caused to be lifted to the normal predetermined position (the uppermost position) by the tensile force of the tension coil spring 22.

(d) Next, the rotary arm unit 3 is rotated through another 120° and in unison therewith the device chuck 21 is rotated through 120° up to the measuring section 4 during which the cam follower 21b of the device chuck 21 follows in motion the downwardly inclined camming surface 24a of the cam member 24. Consequently, the device chuck 21 gradually descends against the resilient force of the coil spring 22 to the measuring section 4 where the device chuck 21 is placed at a predetermined position adjacent the IC socket 4b of the measuring section 4.

(e) The contact-press cylinder 33 is then turned on to force the device chuck 21 to be moved down further against the biasing force of the coil spring 22 so that the leads of the DUT carried by the chuck are pressed and brought into contact with the contacts of the IC socket 4b to ensure electrical connection therebetween.

(f) In the next step, test signals are applied from the IC tester through its test head 43 to the DUT to measure the electrical characteristics (voltage, current, etc.) while the leads of the DUT are maintained in pressure contact with the contacts of the IC socket 4b.

(g) Upon completion of the measurements, the contact-press cylinder 33 is turned off to allow the device chuck 21 with the tested DUT attracted thereagainst to be moved up to the same predetermined position (the uppermost position) adjacent the IC socket 4b as in the step (d) under the tensioning force of the coil spring 22. Whereupon the cam follower 21b of the device chuck is in abutment with the apex of the inverted triangle of the cam member 24.

(h) The rotary arm unit 3 is then further rotated through another 120° and hence the device chuck 21 is rotated through 120° up to the DUT receiving station 6a of the exit stage 6 during which the cam follower 21b of the device chuck 21 follows in motion the upwardly inclined camming surface 24b of the cam member 24. Consequently, the device chuck 21 gradually ascends under the tensioning force of the coil spring 22 to the DUT receiving station 6a of the exit stage 6 where the device chuck 21 is placed at a predetermined position (the uppermost position) adjacent the DUT receiving station 6a of the exit stage 6.

(i) Next, the contact-out cylinder 34 is turned on to force the device chuck 21 to be moved down to a lower position against the resilient force of the coil spring 22 where the tested DUT is positioned immediately above the DUT receiving station 6a of the exit stage 6.

(j) The vacuum generating apparatus is then de-energized to release the negative pressure applied to the suction pad 21c at the lower end of the device chuck 21, so that the tested DUT attracted against the suction pad 21c is released to drop into a positioning recess at the DUT receiving station 6a of the exit stage 6.

(k) The next step is that the contact-out cylinder 34 is turned off to allow the device chuck 21 to be lifted to the normal predetermined position (the uppermost position) under the tensioning force of the coil spring 22.

(l) Finally, the rotary arm unit 3 is rotated through another 120° and hence the device chuck 21 is indexed by 120° up to the DUT delivery station 5a of the soak stage 5 where the device chuck 21 is placed at a predetermined position adjacent the DUT delivery station 5a of the soak stage 5. The aforesaid steps (a) to (l) are thus repeated to continue with the process.

However, in the structure of the rotary arm unit and the device chuck part of the conventional IC handler as described above, there is a possibility that when the coil spring 22 is broken or cut during the 120° rotation of the rotary arm unit 3 and the device chuck 21, the device chuck 21 is dropped down by its own weight and is damaged or broken.

In addition, while the device chuck 21 is rotated through 120° by following in motion the cam member 24 during which the device chuck 21 gradually ascends under the tensioning force of the coil spring 22 from the predetermined position immediately above the measuring section 4 to the DUT receiving station 6a of the exit stage 6, there is a possibility that if the device chuck 21 should stop at an elevation in the mid way due to, for example, the unusual motion of the linear guide 21a, the device chuck 21 collides against the exit stage 6 and either one of them or both are damaged or broken.

SUMMARY OF THE INVENTION

It is an object of the present invention to provide an IC handler which can prevent a dropping of a device chuck caused by a breaking of a coil spring or the like and a stoppage of the device chuck at an elevation in the mid way caused by a defect or failure of a linear guide or the like, thereby to prevent the device chuck and/or an exit stage from being damaged or broken.

According to the present invention, there is provided a device handler for use in a semiconductor device testing apparatus, which comprises: a measuring section for testing a semiconductor device to be tested; rotary arm means having a rotary shaft and three arms secured to and extending radially from the rotary shaft at angular intervals of about 120°; a device chuck mounted for vertical movements on the vertical wall face of each of the arms; a soak stage for transferring a device to be tested to the device chuck; an exit stage for transporting a tested device out of the measuring section; cam means in the form of a semi-annular ring in plan view having a generally inverted triangular peripheral surface, two legs of the inverted triangle formed by the inverted triangular peripheral surface and extending oppositely from the apex of the inverted triangle functioning as camming portions, respectively; and a cam follower rotatably mounted on each of the device chucks and adapted to follow the camming portions of the cam means. The measuring section is located at an elevation below the soak stage and exit stage. The cam means is mounted on the housing of the handler concentrically with the rotary shaft such that the apex of the inverted triangle of the cam means is located at a predetermined position over the measuring section. Accordingly as a device to be tested is transported from the soak stage to the measuring section, the cam means acts to gradually move the device downwardly, and as the tested device is transported from the measuring section to the exit stage, the cam means acts to gradually move the device upwardly. First guide means is mounted to the outer peripheral surface of the cam means along a camming portion of the cam means extending from the vicinity over the device delivery station of the soak stage to the vicinity over the measuring section; second guide means is mounted to the outer peripheral surface of the cam means along a camming portion of the cam means extending from the vicinity above the measuring section to the vicinity over the device receiving station of the exit stage; an arcuate dropping preventive means is mounted to the housing of the handler on the opposite side of the cam means about the rotary shaft of the rotary arm means concentrically with the rotary shaft and in horizontal, the arcuate dropping preventive means extending from the vicinity over the device receiving station of the exit stage to the vicinity over the device delivery station of the soak stage; and hook means is mounted to each of the device chucks such that the hook means can slidably engage with any one of the first guide means, the second guide means and the dropping preventive means when an accident occurs.

The above object of the present invention is achieved by the handler having the construction described above.

DETAILED DESCRIPTION OF THE PREFERRED EMBODIMENT

Figure 1:
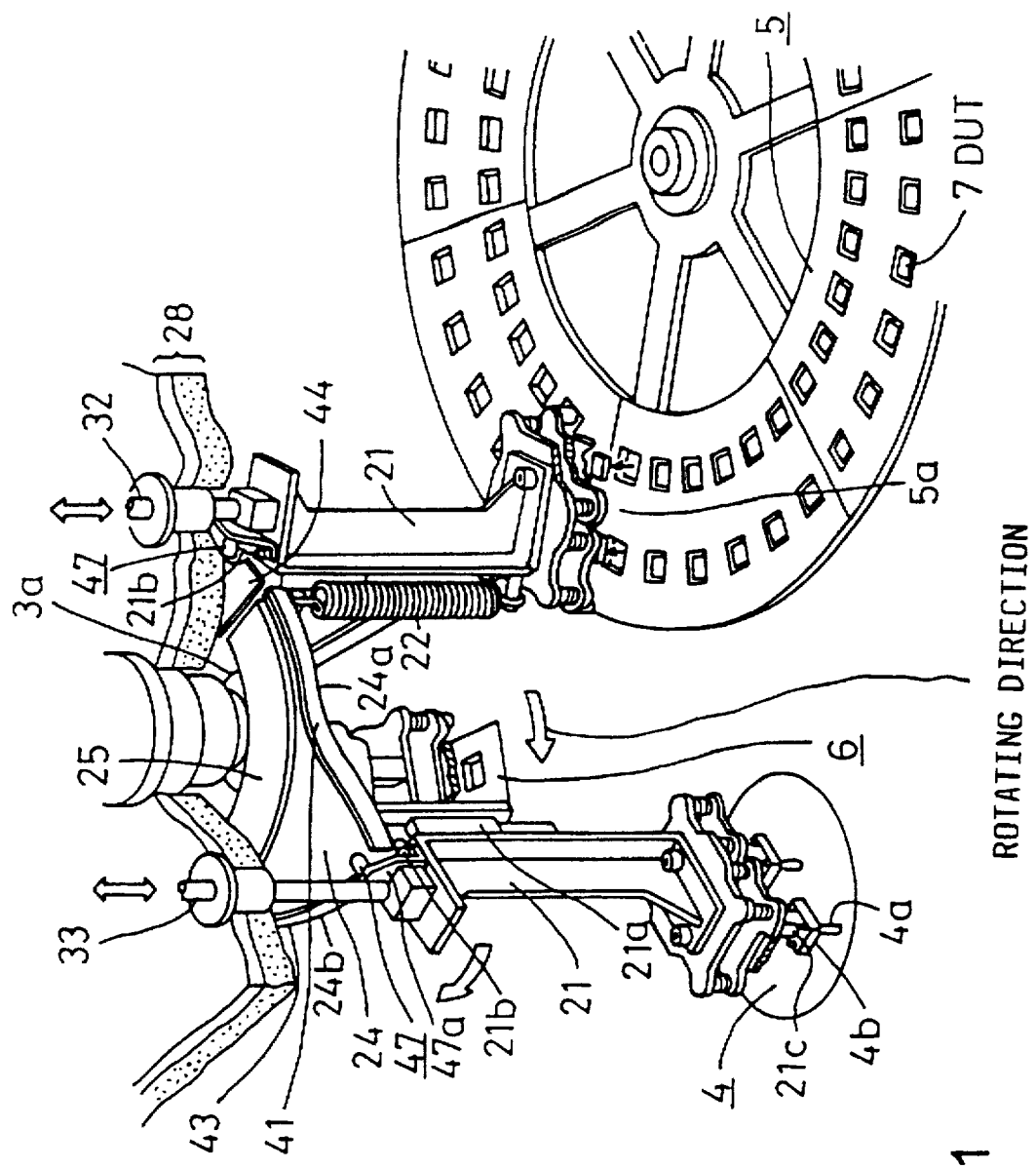
FIG. 1 is a perspective view explaining the general structure of the principal parts of one embodiment of the IC handler according to the present invention.
Figure 5:
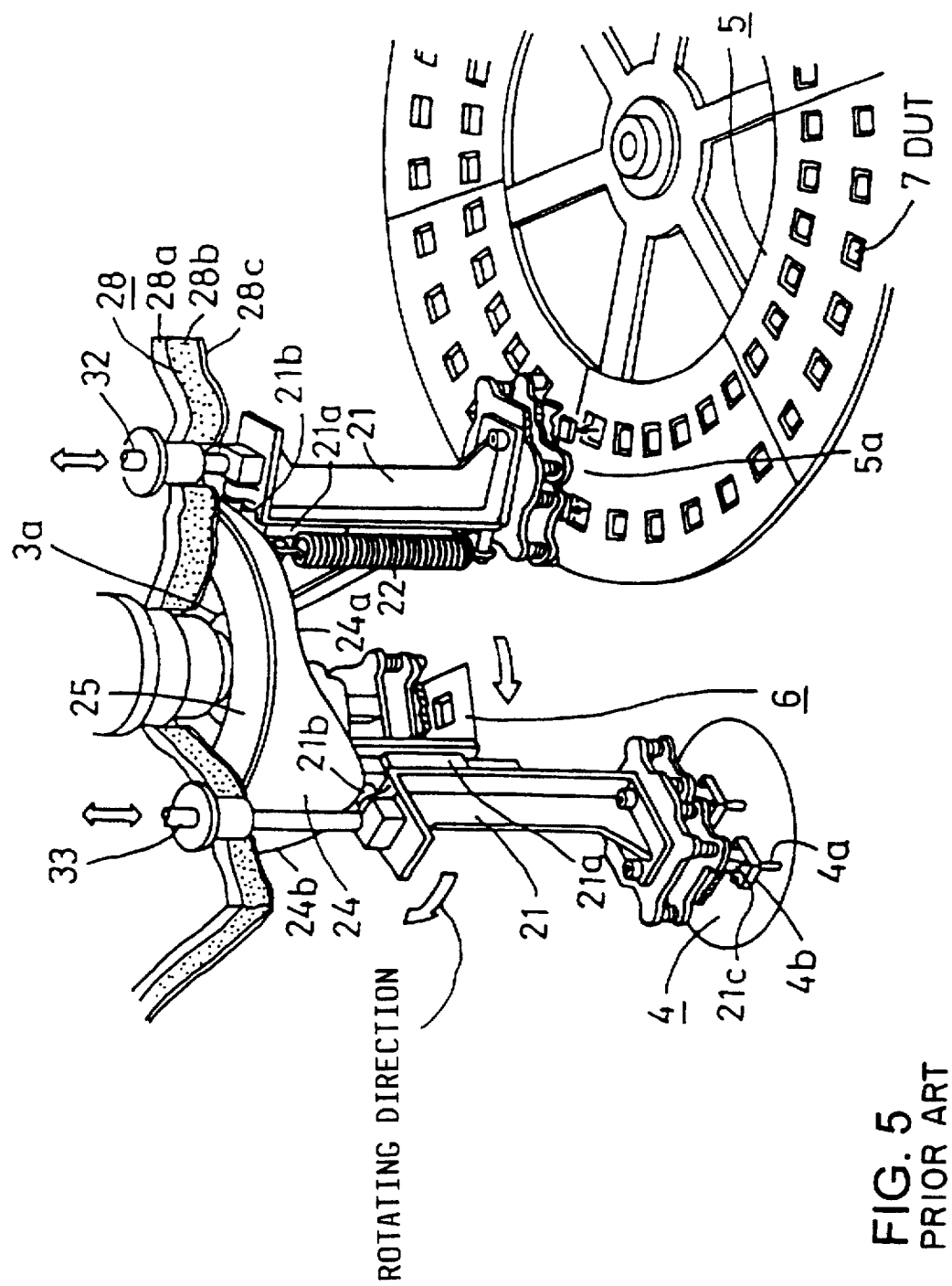
FIG. 5 is a perspective view illustrating the structure of a rotary arm unit and a device chuck used in the IC handler of FIG. 4, together with their peripheral portions.
Figure 6:
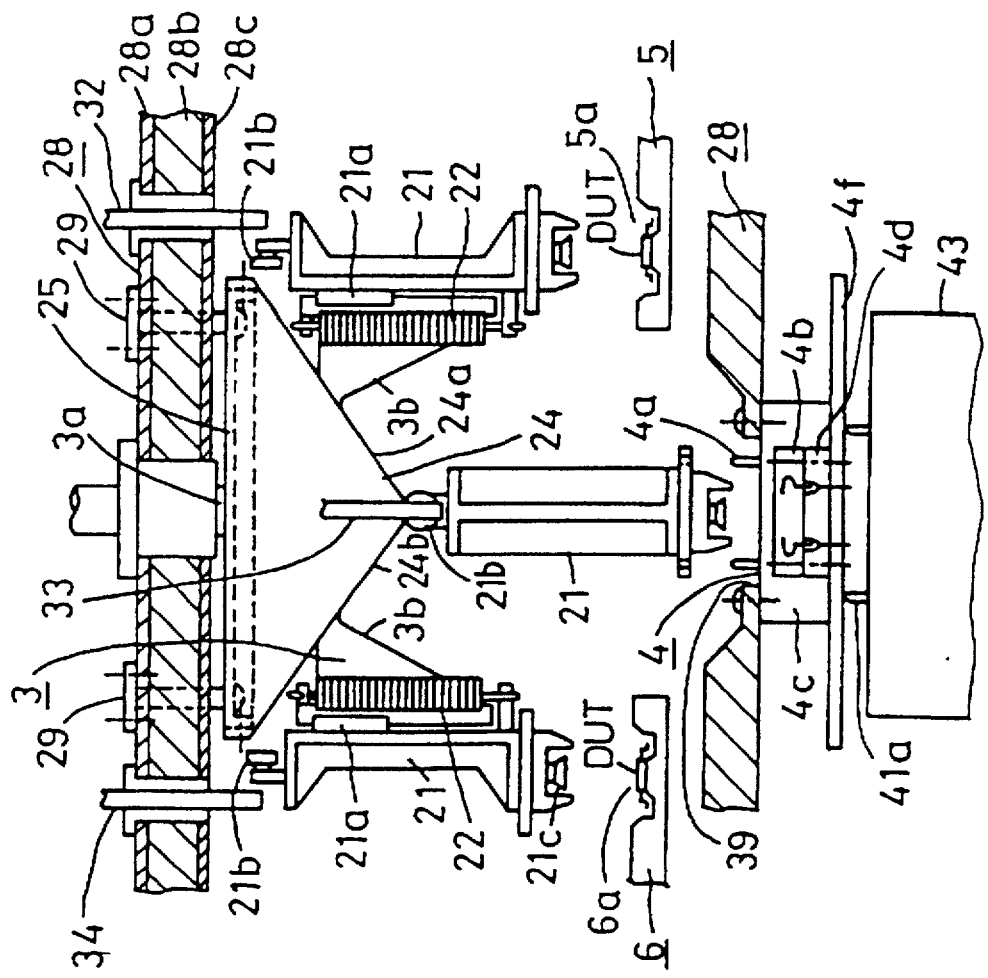
FIG. 6 is a fundamental front view illustrating the principal parts around a measuring section of FIG. 5.
Figure 7:
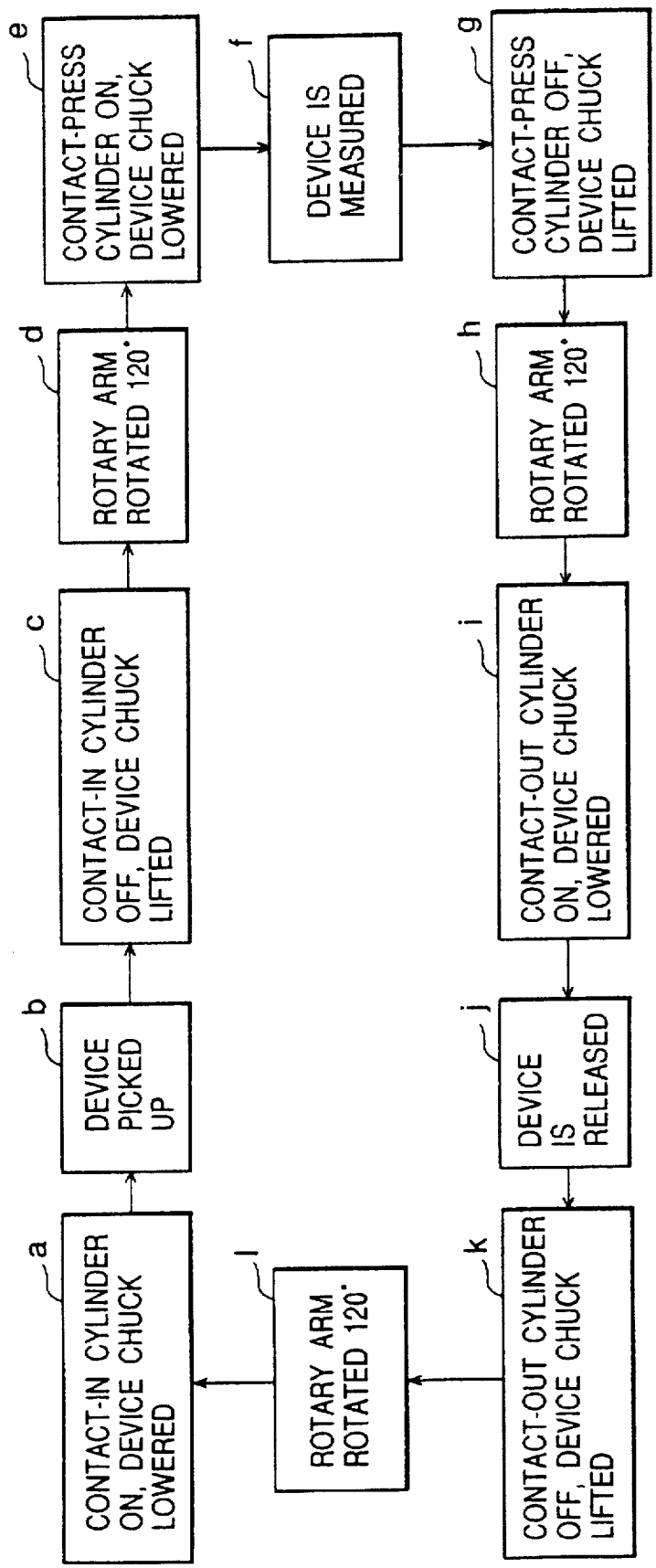
FIG. 7 is a flow chart for explaining the operations of the rotary arm unit and the device chuck used in the IC handler of FIG. 4.

An embodiment of the present invention will be described in detail with reference to FIGS. 1 to 3 in which the parts or elements corresponding to those in FIGS. 5 and 6 are indicated by like reference numerals or characters and will not be described unless required.

In this embodiment, a first arcuate guide rail 41 is fixed by screws via spacers 42 on the outer peripheral surface of the cam member 24 along a camming portion (downwardly inclined surface) 24a of the cam member 24 extending from the vicinity of a position over the DUT delivery station 5a of the soak stage 5 to the vicinity of a position over the measuring section 4. Also, a second arcuate guide rail 43 having nearly the same curvature as that of the first guide rail 41 is fixed by screws via spacers 42 on the outer peripheral surface of the cam member 24 along a camming portion (upwardly inclined surface) 24b of the cam member 24 extending from the vicinity of a position over the measuring section 4 to the vicinity of a position over the DUT receiving station 6a of the exit stage 6. In this case, it is preferable that the arcs of the first guide rail 41 and the second guide rail 43 are selected to have nearly the same curvature and fixed on the outer peripheral surface of the cam member 24 so as for these rails to be on the circumference of the same circle.

Furthermore, on the opposite side of the cam member 24 (a cam holder 25) about the rotary shaft 3a of the rotary arm unit 3 is placed an arcuate dropping preventive plate 44 for preventing the device chuck 21 from dropping down by its own weight. This arcuate dropping preventive plate 44 is placed in horizontal and concentrically with the rotary shaft 3a. The arcuate dropping preventive plate 44 extends from the vicinity of a position over the DUT receiving station 6a of the exit stage 6 to the vicinity of a position over the DUT delivery station 5a of the soak stage 6 and is screwed to the props 45 depending from the ceiling insulation wall 28 of the constant temperature chamber 2. In this case, it is preferable to select the dimension and the curvature of the dropping preventive plate 44 such that the outer arcuate periphery of the dropping preventive plate 44 is on the same circumference of a circle that the first and second guide rails 41 and 43 are on. As is apparent from FIG. 2, in this embodiment, the dimensions and the mounting positions of these parts are selected such that the arcuate outer surfaces of the first guide rail 41 and the second guide rail 43 and the outer arcuate periphery of the dropping preventive plate 44 are on the circumference of the same circle.

On the other hand, a hook 47 is mounted to the upper portion of each of the device chucks 21 via a fixture 47a by means of, for example, screws. These hooks normally move above the first guide rail 41, the second guide rail 43 and the dropping preventive plate 44 with the predetermined gap therebetween as the device chucks rotate.

With the construction described above, when an accident such as a breakage of the coil spring 22 or an abnormal movement of the linear guide 21a or the like occurs, each of the hooks 47 can slide on any one of the first guide rail 41, the second guide rail 43 and the dropping preventive plate 44 in the manner engaged therewith. As a result, even if the coil spring should be broken or cut, the device chuck 21 is engaged with the first guide rail 41, the second guide rail 43 or the dropping preventive plate 44 by means of the associated hook 47, and hence the device chuck 21 is not dropped down its own weight.

Figure 3:
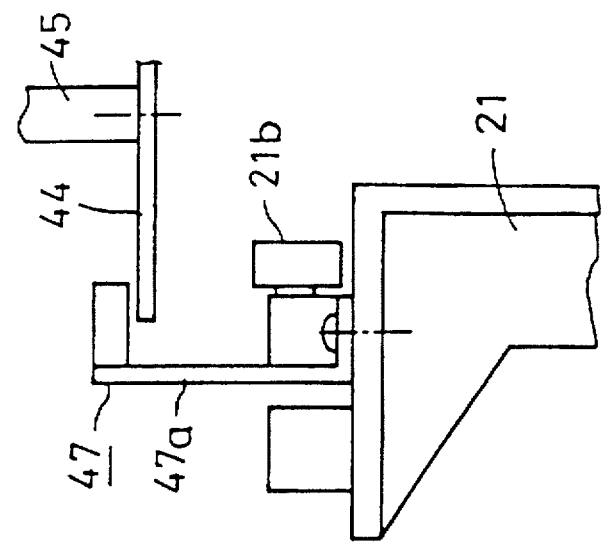
FIG. 3A is a sectional view explaining the operation of a device chuck 21 used in the IC handler of FIG. 1 and illustrating the state that the device chuck 21 is ascending while rotating by following in motion the cam member 24.
FIG. 3B is a sectional view explaining the operation of the device chuck 21 used in the IC handler of FIG. 1 and illustrating the state that the device chuck 21 is rotating below the dropping preventive plate 44.
Figure 3:
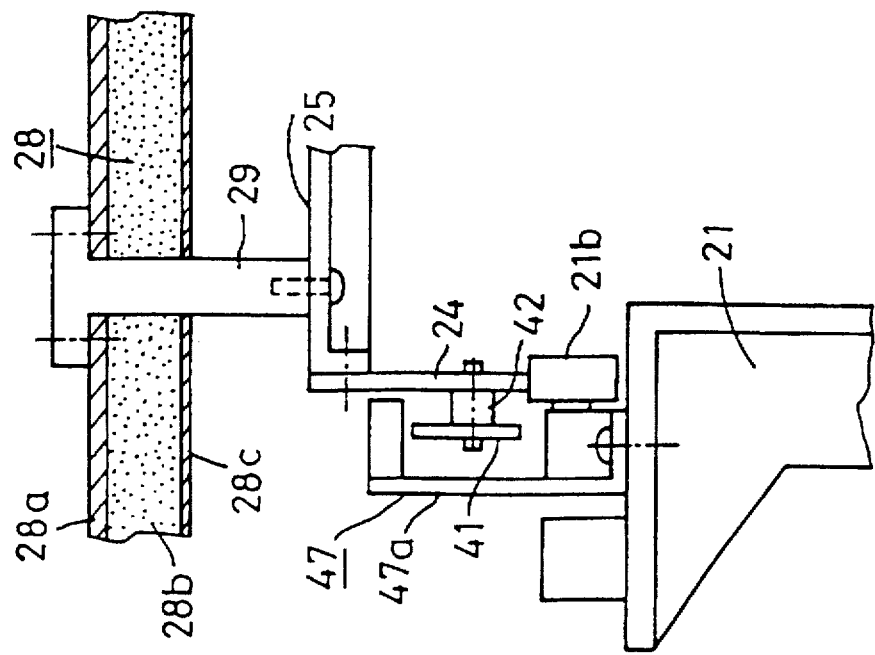
Figure 4:
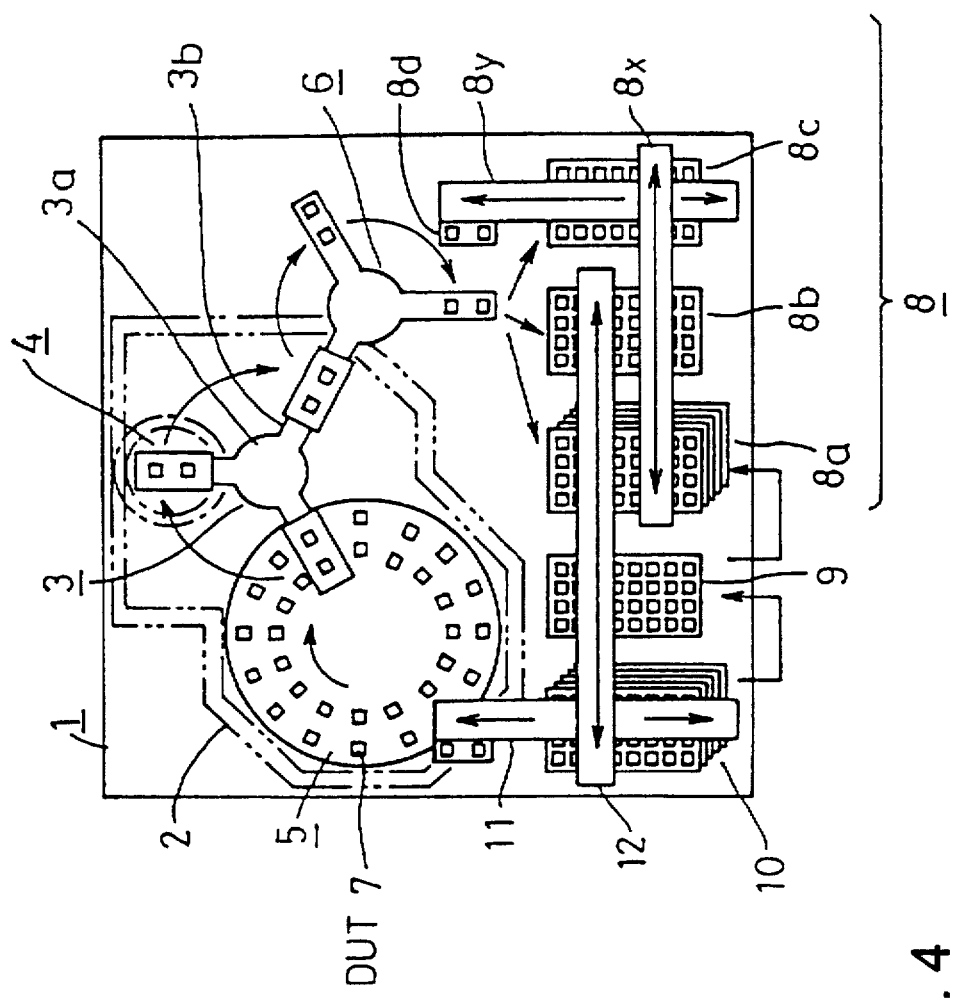
FIG. 4 is a fundamental plan view illustrating the construction of the principal parts of one example of the conventional horizontal transporting type IC handler.

That is, as shown in FIG. 3, an appropriate gap is provided between the lower surface of each of the hooks 47 and the upper surfaces of the first guide rail 41, the second guide rail 43 and the dropping preventive plate 44 so that as far as the coil spring 22 and the linear guide 21a are in the normal conditions, each hook 47 cannot come into contact with these parts during the 120° rotation of the device chuck 21.

Therefore, these hooks 47 do not affect at all the normal operations of the IC handler such as that the cam follower 21b of the device chuck 21 moves following in motion the camming surfaces 24a and 24b of the cam member 24 or that the device chuck 21 moves around the dropping preventive plate 44.

In addition, while the device chuck 21 is rotated from the predetermined position above the measuring section 4 to the vicinity of the exit stage 6 as it gradually ascends by following in motion the cam member 24, if the linear guide 21a does not move smoothly, the associated hook 47 mounted to the device chuck 21 slides on the second guide rail 43 in the manner engaged therewith. Therefore, the hook 47 is gradually moved up as the rotary arm unit 3 rotates. Consequently, the hook 47 forces the associated device chuck 21 to be moved up, and hence the device chuck 21 is moved up to the uppermost position along the second guide rail 43 even if the linear guide 21a does not move smoothly. Thus, each of the device chucks 21 cannot be stopped at an elevation in the mid way of its upward movement and collide with the exit stage 6 unlike the conventional IC handler.

Figure 2:
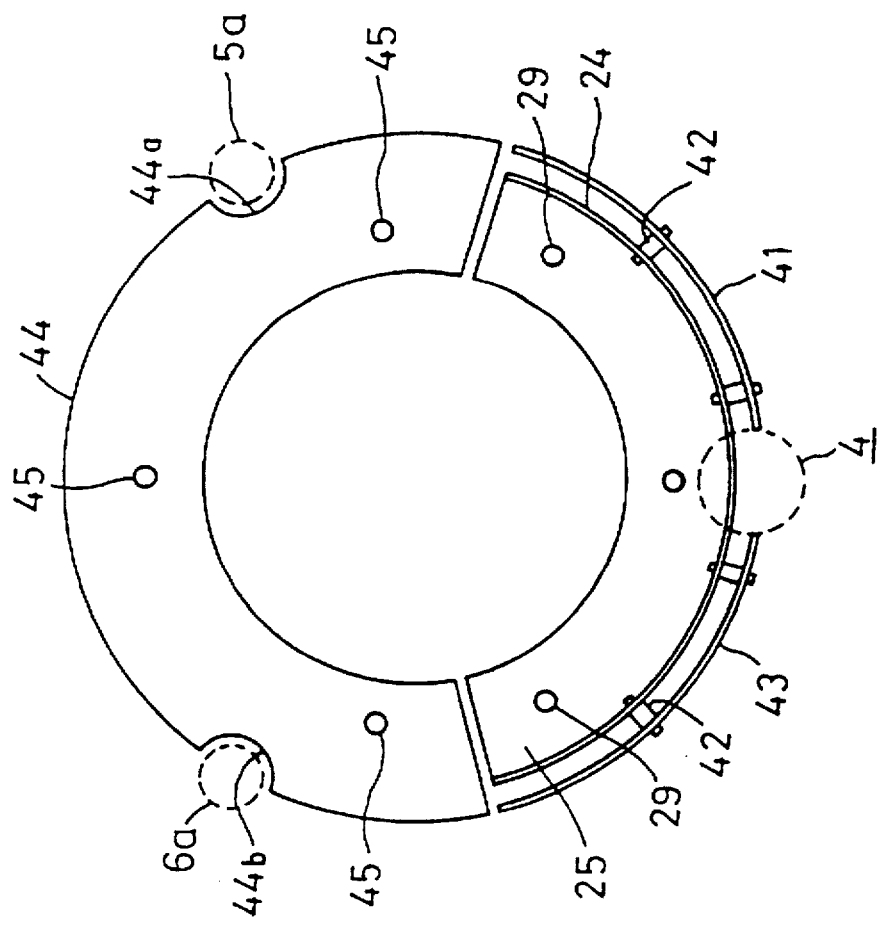
FIG. 2 is a plan view of a cam member 24, first guide rail 41, second guide rail 43 and a dropping preventive plate 44 used in the IC handler of FIG. 1 as viewed from the ceiling side of a constant temperature chamber 2.

In addition, as shown in FIG. 2, the first guide rail 41 and the second guide rail 43 are not provided above the measuring section 4 and are separated from each other at this measuring section 4. This arrangement is required to cause the device chuck 21 to be moved up and down by on/off of the contact-press cylinder 33. Further, semi-circular recesses 44a and 44b are provided at the portions of the outer circumference of the dropping preventive plate 44 above the DUT delivery station 5a of the soak stage 5 and the DUT receiving station 6a of the exit stage 6, respectively. These semi-circular portions are also required to cause the device chuck 21 to be moved up and down by on/off of the contact-in cylinder 32 and the contact-out cylinder 34, respectively.

As mentioned above, according to the present invention, the cam member 24 in the form of a semi-annular ring in plan view having a generally inverted triangular peripheral surface is fixed to the cam holder 25 mounted to the housing of the IC handler, two legs or sides of the inverted triangle formed by the inverted triangular peripheral surface functioning as camming surfaces 24a and 24b, respectively, and further, the first and the second guide rails 41 and 43 are provided along the downwardly inclined camming surface 24a and the upwardly inclined camming surface 24b of the cam member 24, respectively, as well as an arcuate dropping preventive plate 44 is mounted to the housing of the handler on the opposite side of the cam holder 25 about the rotary shaft 3a concentrically with the rotary shaft 3a, and in addition, the hook 47 is mounted to each of the device chucks 21 such that it can normally move over any one of the first guide rail 41, the second guide rail 43 and the dropping preventive plate 44 with a predetermined gap therebetween and it can slidably engage with any one of them when an accident occurs. As a result, even if the coil spring 22 is broken or cut, for instance, during the rotation of the device chuck 21, the hook 47 slides on any one of the first guide rail 41, the second guide rail 43 and the dropping preventive plate 44 in the manner engaged therewith, and hence there is no possibility that the device chuck 21 is dropped down its own weight and is damaged or broken.

Furthermore, while the device chuck 21 is rotated from the predetermined position over the measuring section 4 to the exit stage 6 as it gradually ascends by following in motion the upwardly inclined camming surface 24b of the cam member 24, even if the upward movement of the device chuck 21 should stop at an elevation in the mid way thereof due to, for example, the unusual motion of the linear guide 21a, the associated hook 47 mounted to the device chuck 21 slides on the second guide rail 43 in the manner engaged therewith as the rotary arm unit 3 rotates. Consequently, the hook 47 forces the associated device chuck 21 to be moved up, and hence the device chuck 21 is moved up to the predetermined (uppermost) position. Accordingly, there is no possibility that the device chuck 21 collides against the exit stage 6 and either one of them or both are damaged or broken.

What is claimed is:

1. A handler for use in a semiconductor device testing apparatus for testing semiconductor devices, said handler comprising:

a measuring section for testing a semiconductor device to be tested;

rotary arm means having a rotary shaft and three arms secured to and extending radially from said rotary shaft at angular intervals of about 120°;

a device chuck mounted for vertical movements on the vertical wall face of each of said arms;

a soak stage for transferring a device to be tested to said device chuck;

an exit stage for transporting a tested device out of said measuring section;

cam means in the form of a semi-annular ring in plan view having a generally inverted triangular peripheral surface, two legs of the inverted triangle formed by the inverted triangular peripheral surface and extending oppositely from the apex of the inverted triangle functioning as camming portions, respectively;

a cam follower rotatably mounted on each of said device chucks and adapted to follow said camming portions of said cam means, said measuring section being located at an elevation below said soak stage and exit stage, said cam means being mounted on a housing of said handler concentrically with said rotary shaft such that the apex of the inverted triangle of said cam means is located at a predetermined position above said measuring section, whereby as a device to be tested is transported from said soak stage to said measuring section, said cam means acts to gradually move the device chuck downwardly, and as the tested device is transported from said measuring section to said exit stage, said cam means acts to gradually move the device chuck upwardly;

first guide means mounted to the outer peripheral surface of said cam means along a camming portion of said cam means extending from the vicinity above a device delivery station of said soak stage to the vicinity above said measuring section;

second guide means mounted to the outer peripheral surface of said cam means along a camming portion of said cam means extending from the vicinity above said measuring section to the vicinity above a device receiving station of said exit stage;

arcuate dropping preventive means mounted to the housing of said handler on the opposite side of said cam means about said rotary shaft of said rotary arm means concentrically with said rotary shaft and in horizontal, said arcuate dropping preventive means extending from the vicinity above the device receiving station of said exit stage to the vicinity above the device delivery station of said soak stage; and hook means mounted to each of said device chucks such that said hook means can slidably engage with any one of said first guide means, said second guide means and said dropping preventive means when an accident occurs.

2. The handler according to claim 1 wherein said first guide means and said second guide means are arcuate rails, respectively, and the arcs of these rails are selected to have nearly the same curvature, and the rails are fixed to the outer peripheral surface of said cam means so as for these rails to be on the circumference of the same circle.

3. The handler according to claim 1 wherein said arcuate dropping preventive means is of a plate-like shape placed in horizontal for preventing the device chuck from being dropped down by its own weight.

4. The handler according to claim 2 wherein the curvature of said arcuate dropping preventive means is selected such that the outer arcuate periphery thereof is on the same circumference of a circle that said two arcuate guide rails are on.

5. The handler according to claim 2 wherein the dimensions and the mounting positions of said two guide rails and said arcuate dropping preventive means are selected such that the arcuate outer surfaces of said two guide rails and the outer arcuate periphery of said arcuate dropping preventive means are on the circumference of the same circle.

6. The handler according to claim 1 wherein said hook means is a hook mounted to the upper portion of each of the device chucks via a fixture, and the hooks normally move above said first guide means, said second guide means and said dropping preventive means with a predetermined gap therebetween as the device chucks rotate.

7. The handler according to claim 1 wherein said first guide means and said second guide means are not provided above said measuring section and are separated from each other at this measuring section.

8. The handler according to claim 1 wherein semi-circular recesses are provided at the portions of the outer circumference of said dropping preventive means above the device delivery station of said soak stage and the device receiving station of said exit stage, respectively.

* * * * *